United States Patent [19]

Matsumura et al.

[11] Patent Number: 5,120,971
[45] Date of Patent: Jun. 9, 1992

[54] METHOD FOR REFLECTION-TYPE TWO-DIMENSIONAL PATTERN-REDUCING-COPYING USING SINGLE CONVERGENCE MIRROR AND EQUIPMENT THEREOF

[75] Inventors: Hideki Matsumura; Yoshihide Watanabe, both of Hiroshima, Japan

[73] Assignee: Hiroshima University, Hiroshima, Japan

[21] Appl. No.: 636,989

[22] Filed: Dec. 26, 1990

[30] Foreign Application Priority Data

Dec. 26, 1989 [JP] Japan .................. 1-335032

[51] Int. Cl.$^5$ .................. H01L 21/26
[52] U.S. Cl. .................. 250/492.1; 250/492.2; 355/71; 378/34
[58] Field of Search .......... 250/492.1, 492.2 R, 250/492.22, 492.23; 355/53, 71; 378/34

[56] References Cited

U.S. PATENT DOCUMENTS

| | | | |
|---|---|---|---|
| 4,231,657 | 11/1980 | Iwamatsu | 355/71 |
| 4,355,891 | 10/1982 | Cole et al. | 355/71 |
| 4,980,563 | 12/1990 | George et al. | 250/492.1 |

OTHER PUBLICATIONS

Hideki Matsumura, "Theoretical Consideration on New Reflection Type X-Ray Lithography," Extended Abstracts of the 18th Conference on Solid State Devices and Materials, Tokyo, 1986, pp. 17-20.
H. Kinoshita et al., "Soft x-ray reduction lithography using multilayer mirros," (Jul. 11, 1989), pp. 1648-1650.

Primary Examiner—Jack I. Berman
Assistant Examiner—Kiet T. Nguyen
Attorney, Agent, or Firm—Spencer, Frank & Schneider

[57] ABSTRACT

The invention relates to a method and a device for reflection-type pattern copying, characterized by letting beams of light be incident on a pattern reflection plate on which a pattern to be copied is drawn, converging a pattern figure contained in the light reflected by the pattern reflection plate by means of a concave mirror and copying a two-dimensionally reduced pattern of the above pattern onto a surface of a specimen. Unlike conventional methods, the invention achieves two-dimensional reduced pattern copying by using one concave convergence mirror. A region of copying in which the blur size is not larger than a certain sufficiently small value can be expanded by parallelly arrnaging many concave convergence mirrors having the same shape and combining mechanical sweeping of the pattern reflection plate and the specimen.

19 Claims, 4 Drawing Sheets

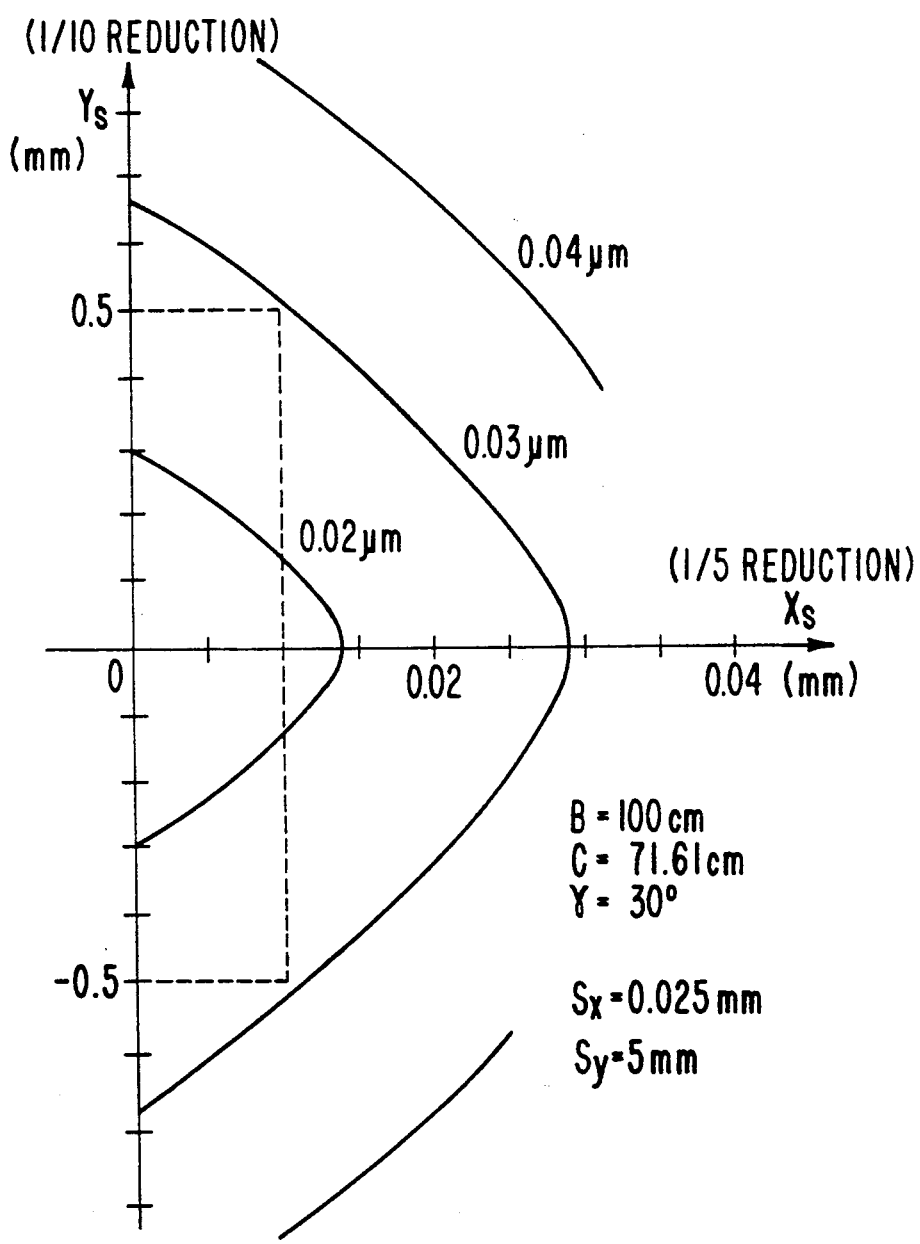

METHOD FOR REFLECTION-TYPE TWO-DIMENSIONAL PATTERN-REDUCING-COPYING USING SINGLE CONVERGENCE MIRROR AND EQUIPMENT THEREOF

BACKGROUND OF THE INVENTION

Field of the Invention and Related Art Statement

The present invention relates to a technique for two-dimensional reduced copying of micro-patterns. The invention has been achieved mainly with the aim of supplying it to the field of solid state electronics, such as the production of very-large-scale-integrated circuits (VLSI), accompanied by micro-patterning. The invention also belongs to ultra-micro optics applicable to developing X-ray microscopes.

The increase in the degree of integration in VLSIs has brought about a decrease in the minimum line width of circuits in VLSIs. For example, the minimum line width of circuits in VLSIs is about 0.5 micron for a dynamic random access memory (DRAM) having a memory capacity of 16 M bits and about 0.3 micron for a DRAM having a capacity of 64 M bits. It is expected that a DRAM having a capacity of not less than 1 G bits will have a minimum line width of about 0.13 micron. In producing VLSIs, circuit patterns have until now been subjected to reduced copying using a system employing an optical lens. It is expected that a UV radiator such as an excimer laser will be used as a light source for copying circuit patterns having a minimum line width of not more than about 0.3 micron.

However, a pattern-reducing optical system which is substantially similar to those applied conventionally will be used even in such a case. But, when it is required to produce VLSIs having a memory capacity of not less than 1 G bits, it is expected that a pattern-copying method using X-rays has to be applied taking into account an expected minimum line width and the too long wavelength of UV light.

The refraction index of lens materials to X-rays is nearly equal to 1, and moreover, the permeability of X-rays in lens materials is extremely small. Therefore, it is impossible to produce a lens having good quality and as a result a conventional pattern-reducing copying method can not be employed.

Accordingly, it has widely been proposed to apply a conventional X-ray pattern-copying method (X-ray lithography method) which uses a mask pattern comprising a thin film 2 to 3 microns in thickness made of light elements which permit X-rays to permeate them and form a pattern thereupon using an X-ray absorber made of heavy elements such as gold, tungsten and the like. In this method, the circuit pattern drawn using the X-ray absorber is copied in its original scale on the surface of a specimen placed beneath the mask pattern by irradiating it with X-rays.

However, the above conventionally proposed X-ray lithography method as a technique for copying micro-patterns has the following problems:

1) It is not easy to produce a thin-film pattern mask.
2) It is not easy to stably maintain a thin-film mask for a long period of time because the position of the micro-pattern deviates due to the strain of the mask caused by heating during X-ray irradiation.
3) No X-ray having a wavelength of not less than several tens of Å can be applied so as to avoid the absorption of X-rays by the thin-film supporting the absorber.
4) Mask adjusting is not easy because the pattern is copied in its original scale.

In order to solve the above problems 1), 2) and 3), one of the present inventors has already proposed a reflection-type pattern-copying method which, without using any thin-film pattern mask, achieves pattern-copying by irradiating a thick-plate substrate on which a pattern is drawn with beams of light such as X-ray, wherein the pattern figure is included in the reflected light (Japanese Patent Application Laid Open No. 60-173551). Furthermore, he published some of the results of studies on pattern-reflection plate formation at the 18th Conference on Solid State Devices and Materials held in Tokyo in 1986 (Matsumura, 18th Conference on Solid State Devices and Materials, Extended Abstract A-1-2, pp. 17-20). Moreover, researchers at NTT Co. have recently published a method which is based on the concept of reflection-type pattern-copying and achieves subjecting the reflected light to two-dimensional reduced copying using Schwartzschild-type convergence mirrors, thereby showing a method for solving the above mentioned problem 4).

However, the two-dimensional conventional reducing optical systems used in the X-ray region as in the case of the Schwartzschild-type mirrors, consist of a combination of two spheric mirrors. All other types, such as the Walter-type system etc. are similarly composed of a combination of at least two curved mirrors. As a result of this, new problems have arisen:

5) The structure and adjustment of a reducing optical system are complicated.
6) Decrease in X-ray intensity is profound because the X-ray is reflected many times inside the reducing optical system.

SUMMARY OF THE INVENTION

An object of the invention is to further develop the technological philosophy which has solved the above mentioned problems 1), 2) and 3). Another object of the invention is to solve the above problems 5) and 6) which have been introduced by conventional techniques for solving the problems 4).

The reflection-type pattern-reducing copying method according to the invention is characterized in that beams of light are subjected to be incident upon a pattern reflection plate on which an original pattern to be copied is drawn, the pattern contained in light reflected from the plate is converged by a concave mirror, and then a two-dimensionally reduced pattern is copied on a surface of a specimen.

Moreover, the reflection-type pattern-reducing copying device of the invention is characterized by having a light source which subjects beams of light to be incident upon a pattern reflection plate on which a pattern is drawn and a concave mirror which converges the pattern figure contained in the light reflected from said plate to copy a pattern. The pattern is a two-dimensional reduction of the original pattern on the surface of the specimen.

A first aspect of the invention is that a two-dimensionally reducing optical system is proposed which uses only one concave convergence mirror. This is different from the know methods using plural mirrors which are complicated and decrease the intensity of X-rays. The invention has been achieved by studying the whole of a single-convergence-mirror-reducing-optical-system, such as the shape of a convergence mirror which can alone perform two-dimensional pattern-reducing copying, a pattern reflection plate, the position of the surface of the specimen, and finding the optimum shape and set-up which provides the best copying. Another aspect of the invention is that because of its simple optical system, it is possible to equivalently expand the region of copying to be performed at one operation by arranging many mirrors having the same shape or those having a partially modified shape. The invention thus includes a technological philosophy concerning the whole of multi-channel-single-convergence-mirror-reducing optical systems, in which many single-convergence-mirror-reducing optical systems are arranged in parallel and or mechanical sweeping is combined as needed to substantially expand the region of copying. That is, the invention not only solves the above problems 1), 2) and 3) but 4) without causing the problems 5) and 6).

According to the invention, two-dimensional reduced copying of micro-patterns is possible. The invention can be applied mainly to the production of electronic devices such as a) production of VLSIs in the future, b) fabrication of electronic devices which need micro-processing such as quantum-effect devices, c) fabrication of surface wave devices, and d) fabrication of DFB lasers.

Moreover, the invention is considered to be applicable to e) the production of micro-mechanical devices and f) genetic engineering if it is possible to induce changes in a molecular level by irradiating a micro-region with x-rays. Furthermore, the optical system of the invention in itself may be applied to g) X-ray microscopes by reversely forwarding a beam of light. In this case, a picture correcting system using a computer is needed at the same time because the pattern reducing ratios in the longitudinal and transverse axes are sometimes different from each other when carrying out the method of the invention. By combining the applications g) and f), the invention may be applied as an X-ray scalpel to molecular biology which induces change in genes by irradiating only desired positions with X-rays while observing the picture. The same principle may be applied to polymer chemistry and medical fields.

In a preferred embodiment of the invention, a concave mirror is used which has a shape of an irregular rotated ellipse or elliptical body whose axis of rotation inclined at certain angles to the major and minor axes of an associated ellipse defined hereinafter and drawn at a position having a certain distance from the center of the ellipse. In the present specification, the irregular rotated elliptical body may be called a modified ellipsoid. Each of the forms which are modified by applying a small functional correction to the direction of the rotating axis, the direction of the ellipse or both of them are included in the scope of the invention.

BRIEF DESCRIPTION OF THE DRAWINGS

FIG. 4 is a graph showing the distribution of blur size in the copied pattern on the surface of a specimen for the case that the longer axis B of the ellipse is 100 cm, the shorter axis C is 71.61 cm, the rotation radius A is 53.37 cm, the coordinate of the center of the mirror is $Y_c=46.24$ cm, $Z_c=160.1$ cm, and the mirror size is $S_x=0.025$ mm, $S_y=5$ mm.

DETAILED DESCRIPTION OF THE INVENTION

Figure 1:
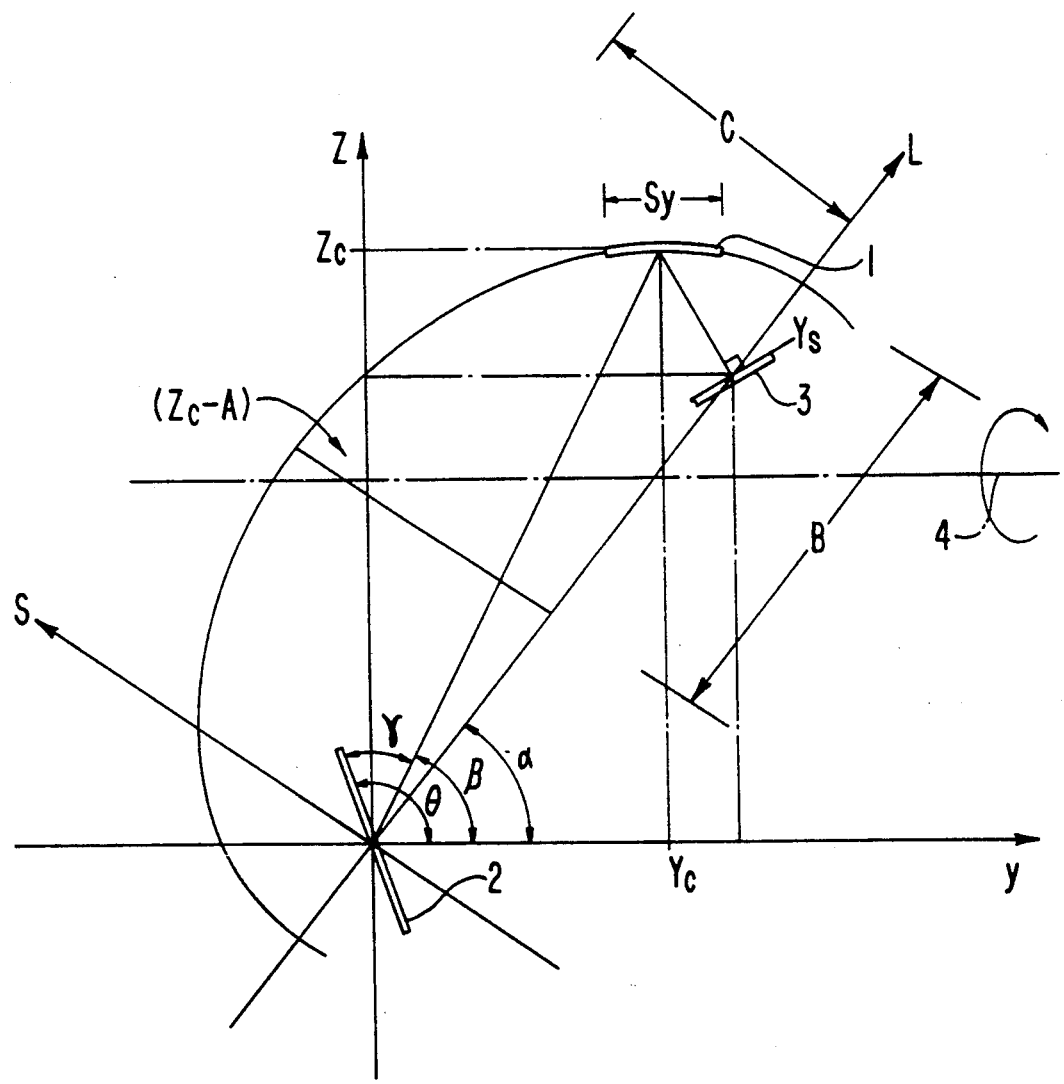
FIG. 1 shows the shape of a convergence mirror of the invention and a set-up of a pattern reflection plate, specimen surface and the convergence mirror.

FIG. 1 is a schematic drawing showing in a three-dimensional space coordinate (x,y,z) a concave convergence mirror 1, a pattern reflection plate 2 and the surface 3 of a specimen upon which a reduced pattern is projected, each of which is located on a cross-section $x=0$. In FIG. 1, the major and minor axes of an associated ellipse forming the concave mirror 1 are B and C, respectively. A rotating axis 4 for forming a an irregular rotated ellipse or modified ellipsoid is inclined at an angle $\alpha$ from the straight line L containing the major axis of the ellipse. The center of the mirror 1 is set at a position of $(0, Y_c, Z_c)$ and the size of the mirror is $s_y$ in the direction of an axis of the ellipse and $s_x$ in the direction of the rotation axis (i.e., in the direction perpendicular to the plane on which FIG. 1 is drawn). The mirror size may be interpreted as the size of the mirror itself or the size of a group of beams of light projected onto the mirror passing through a slit placed between the pattern reflection plate 2 and the mirror 1.

The rotating axis 4 is on the plane $x=0$, and passes through a point $Z_c$-A. The A corresponds to the rotation radius, that is, A is a specific distance from the rotation axis and is determined as discussed below. Hence, this mirror has a shape symmetrical to the plane $x=0$. FIG. 1 is drawn in such a way that one of the focuses of the ellipse is selected as the origins of the coordinate (x,y,z). The pattern reflection plate 2 forms a plane perpendicular to the plane y-z and is placed near the origin of coordinates and the specimen 3 similarly forms a plane perpendicular to the plane y-z and is placed near another focus of the ellipse. The surface of the speciment 3 is placed in such a way that light passing through the center of the pattern reflection plate 2 and reflected at the central point $(0, Y_c, Z_c)$ of the convergence mirror 1 is incident upon it in an almost perpendicular direction. The angle between the pattern reflection plate 2 and the plane $z=0$ (x-y plane) is $\theta$, the angle between the line connecting the central points of the pattern reflection plate 2 and the mirror 1 and the plane $z=0$ is $\beta$, and the angle between the line connecting the central points of the pattern reflection plate 2 and the mirror 1, and the pattern reflection plate 2 is $\gamma$.

In this embodiment, the pattern reflection plate 2 and the surface of the specimen 3 are placed as described above. In connection with this, there are specific relations between the shape of the mirror 1 and the positions of the mirror and the specimen, determined by the reduction ratio of the pattern. That is, there are the following relations among the above values, provided that the pattern reduction ratio in the x direction is $1/m_x$.

The rotation radius A is in the neighborhood of a value expressed by:

$$A = \frac{2Z_c}{m_x + 1} \quad (1)$$

and the angle $\alpha$ between the rotation axis 4 and the straight line L containing the longer axis of the ellipse has a value expressed by:

$$\sin \alpha = \frac{(m_x - 1) \cdot C}{2\sqrt{m_y} \cdot Y_{CL}} \quad (2)$$

wherein $$Y_{CL} = \sqrt{B^2 - C^2})$$

Using the coordinate system as shown in FIG. 1, the shape of the irregular rotated ellipse and consquently the shape of the mirror 1 is expressed by:

$$f_0(x,y) = (Z_C - A) + \sqrt{\{f_0(0,y) - (Z_C - A)\}^2 - x^2} \quad (3)$$

wherein the equation for the associated ellipse is $$f_0(0,y) = \frac{Y_{CL} \cdot \sin\alpha \cdot (Y_{CL} \cdot \cos\alpha \cdot y + C^2) + BC \cdot \sqrt{C^2 - y^2 + 2Y_{CL} \cdot \cos\alpha \cdot y}}{B^2 \cdot \cos^2\alpha + C^2 \cdot \sin^2\alpha} \quad (4)$$

Other than the shape expressed by equation (3), the mirror 1 according to the invention may have a shape obtained by slightly correcting the fundamental shape expressed by equation (3). That is, a function expressing the shape of the mirror 1 may generally be expressed by:

$$f(x,y) = f_0(x,y) + \sum_{i=1}^{N} a_i \cdot x^{2i} + \sum_{j=1}^{M} b_j \cdot y^j \quad (5)$$

wherein i, j, N, M are in each an integral, and ai and bj are each a small quantity.

Furthermore, $Y_c$ and $Z_c$ expressing the central point of the mirror 1 are respectively expressed by:

$$Y_c = Y_{CL} \cdot \cos\alpha + Y_{CL}^2 \cdot \sin\alpha \cdot \cos\alpha \sqrt{\frac{B^2 \cdot \cos^2\alpha + C^2 \cdot \sin^2\alpha}{B^2C^2 + Y_{CL}^4 \cdot \sin^2\alpha \cdot \cos^2\alpha}} \quad (6)$$

$$Z_c = Y_{CL} \cdot \sin\alpha + \sqrt{\frac{B^2C^2 + Y_{CL}^4 \cdot \sin^2\alpha \cdot \cos^2\alpha}{B^2 \cdot \cos^2\alpha + C^2 \cdot \sin^2\alpha}} \quad (7)$$

That is, when $m_x$, B and C, namely the reduction ratio and the principal axes of the ellipse, are determined in the single-convergence-mirror-two-dimensional optical system according to the invention, the factors determining the shape of the mirror, such as the location (0, $Y_c$, $Z_c$) of the single-convergence mirror 1, the angle $\alpha$ between the rotation axis 4 and the line L containing the longer axis of the ellipse, the position $z = Z_c - A$ of the rotation axis 4 and the rotation radius A, are determined uniquely. The inclination angle $\theta$ of the pattern reflection plate 2 still cannot be determined uniquely. However, in order to obtain a wide region of reduced copying, it is necessary to set $\theta$ in the neighborhood of a certain restricted value because the region of reduced copying having a blur size of not more than a desired value, for example 0.03 micron, widens greatly in the neighborhood (within −0.1 degree) of the restricted value of $\theta$.

Figure 2:
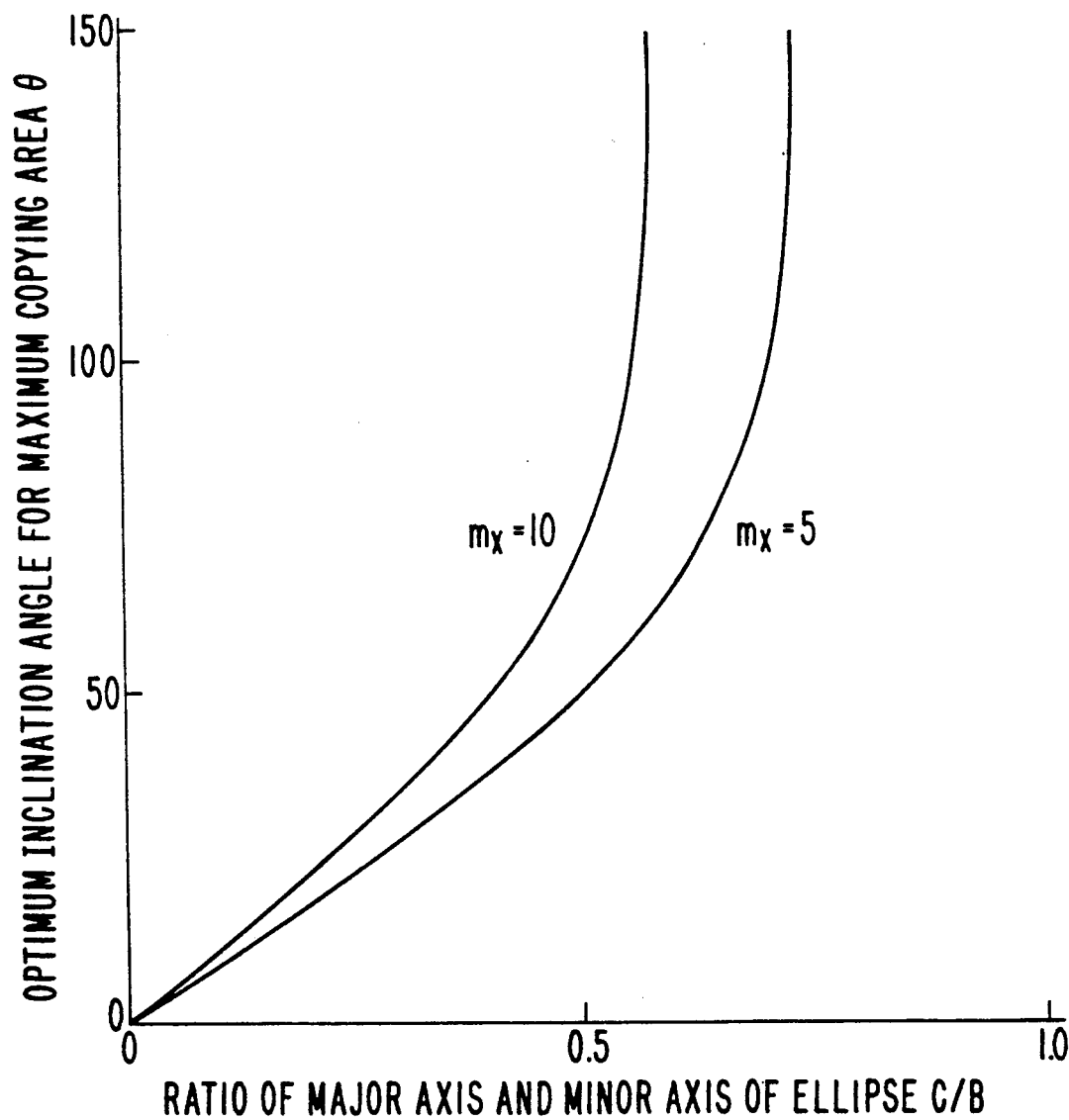
FIG. 2 is a graph showing the relation between q and C/B for a reducing optical system having the structure of FIG. 1, wherein q is the inclination angle of the pattern reflecting plate making the copying area maximum under the condition that the blur size is below a certain limit, B is the longer axis of the ellipse and C is the shorter axis of the ellipse. The graph is drawn for the cases of $m_x=5$ and $m_x=10$, wherein $m_x$ is the reduction ratio of the pattern in the x-direction.

FIG. 2 shows the value of $\theta$ as a function of C/B for $m_x = 5$ and $m_x = 10$ when the reduced copying region is widened. The relations (1) to (7) arising when a reduction ratio $m_x$, the major and minor axes of an ellipse are determined and the conditions imposed on $\theta$ such as shown in FIG. 2 are important elements constituting the invention. All the single-convergence-mirror-reducing optical systems satisfying these relations and conditions are included within the scope of the invention.

As described above, $\alpha$ and optimum $\theta$ can be determined in the optical system of the invention when $m_x$, B and C are determined.

When $\alpha$ is determined, the angle $\beta$ which is the angle viewing the central point of the mirror 1 from the central point of the pattern reflection plate 2 is determined. $\gamma$ is also determined uniquely because as shown in FIG. 1 there is a relation:

$$\theta = \gamma + \beta \quad (8)$$

Since $\gamma$ is the angle between the pattern reflection plate and a beam of light reflected therefrom, the pattern drawn on the pattern reflection plate is reduced almost sin $\gamma$-fold on the surface of the specimen 3 placed nearly perpendicular to the reflected light. The reduction ratio $1/m_y$ in the direction perpendicular to the x-axis (direction of Ys axis in FIG. 1) on the surface of the specimen is approximately expressed as $$m_y = m_x / \sin \gamma \quad (9)$$

in the optical system of the invention, even when the reduction ratio in the x-direction is $1/m_x$-fold which is related to the rotation radius of the rotated ellipse body, the position of the pattern reflection plate and the position of the surface of the specimen. That is, in the optical system of the invention, the pattern on the pattern reflection plate is printed with different reduction ratios in the directions of the longitudinal and transverse axes. In this connection, the method of the invention may be an insufficiently reduced copying method as far as accurate reduced copying of a pattern figure is concerned. However, this is not a substantial problem as far as copying of patterns for producing VLSIs is concerned, because the problem can be avoided by preparing a pattern reflection plate on which a pattern is drawn according to the difference of reduction ratios.

That is, it may be said that the optical system of the invention performs two-dimensional pattern reduction using only one convergence mirror instead of conventional methods which use plural mirrors, by sacrificing the equality of reduction ratios in the longitudinal and transverse directions. Herein, the value of $\gamma$ is uniquely determined from α and the optimum value of θ when B, C and $m_x$ are determined, so that when it is desired to change γ while keeping $m_x$ at a desired value, it is necessary to change the value of B or C.

Since the optical system of the invention performs two-dimensional reduced copying of patterns using only one convergence mirror unlike the conventional methods, a new optical system can be realized easily which has been difficult in the conventional methods. That is, the region of two-dimensional reduced copying can relatively easily be expanded by arranging many concave convergence mirrors in parallel.

Figure 3:
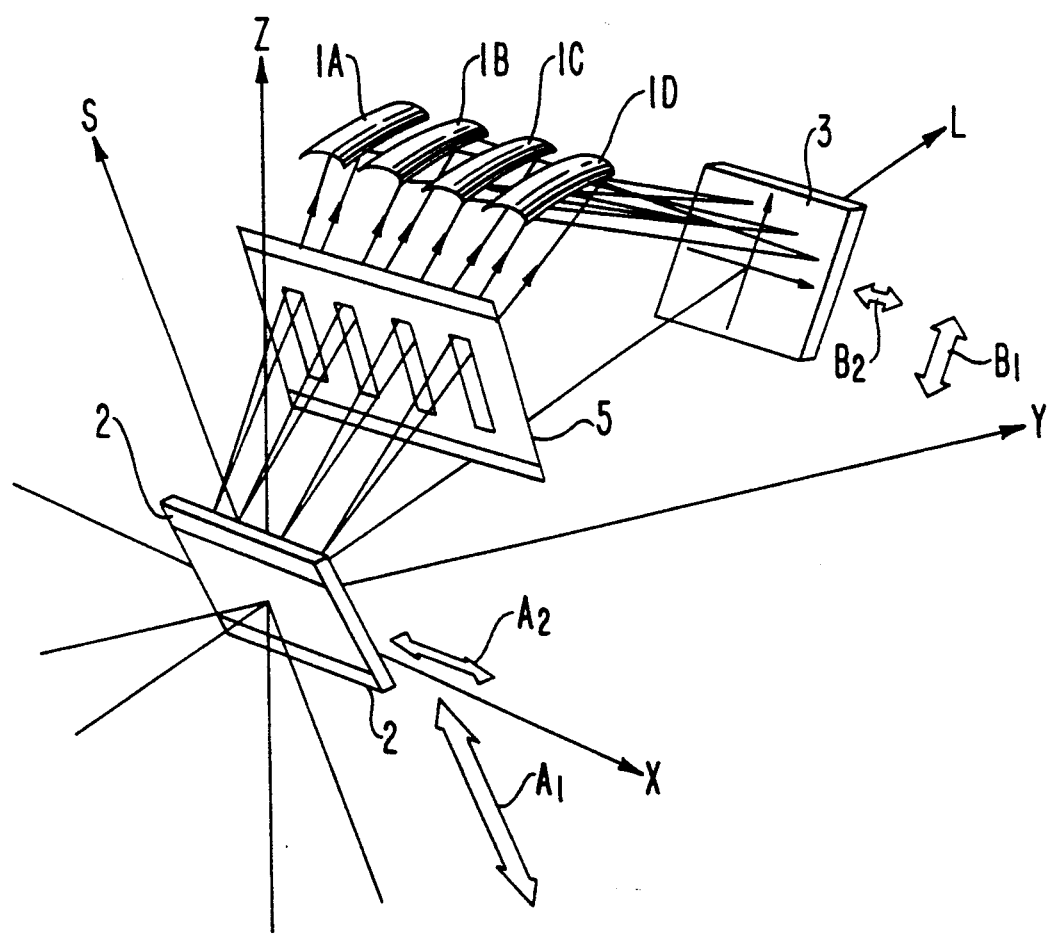
FIG. 3 is a schematic drawing of a multi-channel-single-convergence-mirror-reduced-copying optical system according to the invention which enables expanding the copying area by parallelly arranging many reflection-type-pattern-reducing optical systems, each of which is similar the that shown in FIG. 1 in which a single-convergence mirror is used.

FIG. 3 is a schematic drawing showing a multi-channel-single-convergence-mirror-reducing optical system based on the parallelly arranged single convergence mirrors. Beams of light reflected at a pattern reflection plate 2 reach, through a slit 5, convergence concave mirrors 1A, 1B,—being located at positions corresponding to the respective positions of reflections. They are reduced and converged by the respective mirrors, and then form figures at respective positions on the surface of a specimen. In this optical system, it is necessary to carry out two-dimensional mechanical sweeping of the pattern reflection plate 2 and the surface of the specimen 3 at a rate corresponding to the reduction ratio. The plate and the specimen have to be swept synchronizedly as shown in FIG. 3 with arrows $A_1$, $A_2$, $B_1$, and $B_2$. Since many mirrors 1A, 1B,—are arranged, the width of this mechanical sweeping is kept small, so that the accuracy is improved. Such a multi-channel-single-convergence-mirror-reducing optical system can be realized only by the present invention.

In order to examine the effect of the invention, an example of practical application of the optical system of the invention to two-dimensional reduction of a pattern is described.

FIG. 4 shows the degree of convergence at a coordinate ($X_s$, $y_s$) on the surface of a specimen. In particular, FIG. 4 shows the extent of blur size of the figure of a copied pattern, under the conditions that B=100 cm, C=71.61 cm, γ=30-, $m_x$=5, $m_y$=10 and the size of a mirror or that of the beams of light reflected at a pattern reflection plate and projected through a slit placed in front of the concave mirror onto the concave mirror is $S_x$=0.025 mm and $S_y$=5 mm. In the x-direction, all of the optical elements shown in FIG. 1 including the mirror are placed symmetrical to the plane x=0, so that the region of $X_s$<0 in FIG. 4 has the same shape as that of $X_s$>0. That is, when a curve is considered in the region of $x_s$<0, the blur size in the region surrounded by the curve on the specimen is limited to the blur size assigned to each curve, such as 0.02 microns, 0.03 microns and so on.

For example, this figure shows that a region having a dimension of 1 mm in $y_s$-direction and 0.020 mm as a total in $x_s$-direction can be obtained in which the blur size is within 0.03 microns. That is, a region having a dimension of 10 mm and 0.100 mm on the pattern reflection plate is reduced-copied on the surface of the specimen to a region having a dimension of 1 mm×0.020 mm, which is 1/5 the original pattern in $x_s$-direction and 1/10 in $y_s$-direction, with a blur size of not more than 0.03 microns (300 Å). Although this copied region is slender, the reduced region can easily be expanded in $x_s$-direction by constructing a multi-channel reducing system as shown in FIG. 3. In this case, for example, when 300 pieces of single convergence mirrors having the same shape are arranged in parallel with a pitch of 0.1 mm, two-dimensional reduced copying having a dimension of 30 mm×30 mm with a blur size of not more than 0.03 microns can easily be made on the surface of a specimen by repeating mechanical sweeping of 0.1 mm in $x_s$-direction and shifting with a width of 1 mm in $y_s$-direction. Since a large number of similar mirrors can be produced using one mold, it is not impossible to construct an optical system in which 300 mirrors are arranged in parallel. When the region of copying on the surface of a specimen is as large as 30 mm×30 mm, it is possible to fully copy a circuit pattern for one chip of DRAM having a capacity of 1 G bits or 4 G bits.

In the setting-up condition of a concrete example shown in FIG. 4, α and θ were set to about 66.6° and about 104°, respectively.

What is claimed is:

1. A method for reflection-type pattern copying, comprising the steps of:
   impinging beams of light on a pattern reflection plate on which a pattern to be copied is drawn;
   converging a pattern figure contained in the light reflected from the pattern reflection plate by means of a concave mirror; and
   copying a two-dimensionally reduced pattern of the above pattern figure onto a surface of a specimen, wherein the concave mirror has a shape of an irregular rotated ellipse having an associated ellipse and having a rotation axis which is inclined with respect to the major axis of the associated ellipse at a specific angle α corresponding to the reduction ratio of the two-dimensionally reduced pattern and the rotation axis is shifted from the concave mirror by a specific distance A.

2. The method for reflection-type pattern copying according to claim 3, wherein the light is selected from at least one of x-ray radiation, far ultraviolet radiation, ultraviolet radiation, and visible radiation.

3. A method for reflection-type pattern copying according to claim 1, wherein the concave mirror has a shape obtained by slightly functionally correcting the irregular rotated ellipse.

4. The method for reflection-type pattern copying according to claim 1, wherein the specific angle α is defined such that $0 \leq α \leq 90°$, and the specific distance is defined such that $0 \leq A \leq B$, where B is the length of the major axis of the associated ellipse.

5. The method for reflection-type pattern copying according to claim 1, wherein the pattern reflection plate is placed approximately at one of the focuses of the associated ellipse, and the surface of the specimen is placed approximately at the other focus of the associated ellipse.

6. The method for reflection-type pattern copying according to claim 1, wherein the two-dimensionally reduced pattern is expanded to a maximum while maintaining a blur size below a certain sufficiently small value by setting a setting angle of the pattern reflection plate to an angle within a specific range of angles determined by the lengths of the major and minor axes of the associated ellipse.

7. The method for reflection-type pattern copying according to claim 1, wherein the two-dimensionally reduced pattern is equivalently expanded by parallelly arranging many concave mirrors all having one of said shape and a corrected shape obtained by slightly correcting said shape while maintaining a blur size below a certain sufficiently small value.

8. The method for reflection-type pattern copying according to claim 1, wherein the two-dimensionally reduced pattern has a blur size not larger than a certain sufficiently small value, while the two-dimensionally reduced pattern is expanded by synchronizedly mechanically sweeping both the pattern reflection plate and the surface of the specimen at a rate adjusted in accordance with the reduction ratio of the two-dimensionally reduced pattern.

9. A device for reflection-type pattern copying, comprising:
   a light source which transmits beams of light to a pattern reflection plate on which a pattern to be copied is drawn; and
   a concave mirror which converges a pattern figure contained in light reflected by the pattern reflection plate and copies a two-dimensionally reduced pattern of the pattern to be copied onto a surface of the specimen wherein said concave mirror has a shape of an irregular rotated ellipse having a rotation axis which is inclined with respect to the major axis of the associated ellipse at a specific angle $\alpha$ corresponding to a reduction ratio of the two-dimensionally reduced pattern and the rotation axis is shifted from the concave mirror by a specific distance A.

10. The device for reflection-type pattern copying according to claim 9, wherein said light source emits at least one of X-ray radiation, far ultraviolet radiation, ultraviolet radiation, and visible radiation.

11. The device for reflection-type pattern copying according to claim 9, wherein said concave mirror has a shape obtained by slightly functionally correcting the irregular rotated ellipse.

12. The device for reflection-type pattern copying according to claim 9, wherein the specific angle $\alpha$ is defined such that $0 \leq \alpha \leq 90°$ and the specific distance A is defined such that $0 \leq A \leq B$, where B is the length of the major axis of the associated ellipse.

13. The device for reflection-type pattern copying according to claim 9, wherein the pattern reflection plate is located approximately at one of the focuses of the associated ellipse, and the surface of the specimen is placed approximately at the other focus of the associated ellipse.

14. The device for reflection-type pattern copying according to claim 9, wherein the making the blur size not larger than a certain sufficiently two-dimensionally reduced pattern is expanded to a maximum while maintaining a blur size below a certain sufficiently small value by setting a setting angle of the pattern reflection plate to an angle within a specific range of angles determined by the lengths of the major and minor axes of the associated ellipse.

15. The device for reflection-type pattern copying according to claim 9, wherein a blur size of the two-dimensionally reduced pattern is not larger than a certain sufficiently small value while the two-dimensionally reduced pattern is equivalently expanded by parallelly arranging many concave mirrors all having one of said shape and a corrected shape obtained by slightly correcting said shape of the irregular rotated ellipse.

16. The device for reflection-type pattern copying according to claim 9, wherein the two-dimensionally reduced pattern has a blur size not larger than a certain sufficiently small value, while the two-dimensionally reduced pattern is expanded by synchronizedly mechanically sweeping both the pattern reflection plate and the surface of the specimen at a rate adjusted in accordance with the reduction ratio of the two dimensionally reduced pattern.

17. A method for reflection-type copying, comprising the steps of:
    reflecting a pattern containing light from a pattern reflection plate on which a pattern to be copied is drawn;
    converging the pattern containing light to a two-dimensionally reduced pattern on a surface of a specimen using a concave mirror shaped as an irregular rotated ellipse having a rotation axis which is shifted from the major axis of an associated ellipse.

18. A method for reflection-type copying, comprising the steps of:
    reflecting a pattern containing light from a pattern reflection plate on which a pattern to be copied is drawn;
    converging the pattern containing light to a two-dimensionally reduced pattern on a surface of a specimen using a concave mirror shaped as an irregular rotated ellipse having a rotation axis inclined at a specific angle with respect to the major axis of an associated ellipse, wherein the specific angle corresponds to the reduction ratio of the pattern.

19. A method for reflection-type copying, comprising the steps of:
    reflecting a pattern containing light from a pattern reflection plate on which a pattern to be copied is drawn; and
    converging the pattern containing light to a two-dimensionally reduced pattern on a surface of a specimen using a concave mirror shaped as an irregular rotated ellipse which has an associated ellipse rotated about a rotation axis inclined at a specific angle with respect to the major axis of the associated ellipse, wherein the specific angle corresponds to a reduction ratio of the pattern and the rotation axis of the irregular rotated ellipse is shifted from the major and minor axes of the associated ellipse.

* * * * *